United States Patent [19]

Helbig, Sr. et al.

[11] Patent Number: 5,278,847
[45] Date of Patent: Jan. 11, 1994

[54] FAULT-TOLERANT MEMORY SYSTEM WITH GRACEFUL DEGRADATION

[75] Inventors: Walter A. Helbig, Sr., Medford Lakes; Thomas Anastasia, Sicklerville, both of N.J.

[73] Assignee: General Electric Company, Philadelphia, Pa.

[21] Appl. No.: 635,068

[22] Filed: Dec. 28, 1990

[51] Int. Cl.[5] ............................................. G06F 11/10
[52] U.S. Cl. ................................ 371/40.2; 371/40.3; 371/40.4
[58] Field of Search ................... 370/40.1, 40.2, 40.3, 370/40.4, 21.6, 10.2, 10.3; 365/200

[56] References Cited

U.S. PATENT DOCUMENTS

| | | | |
|---|---|---|---|
| 4,939,694 | 7/1990 | Eaton et al. | 371/10.2 |
| 4,970,648 | 11/1990 | Capots | 364/424.06 |
| 5,127,014 | 6/1992 | Raynham | 371/40.1 |
| 5,134,616 | 7/1992 | Barth, Jr. et al. | 371/10.2 |

Primary Examiner—Vincent P. Canney
Attorney, Agent, or Firm—Geoffrey H. Krauss; Allen E. Amgott

[57] ABSTRACT

A fault-tolerating memory system has a data memory with a large number (M+N) of data storage words each having a length greater than the length of user data to be stored in that word; the extra word length is used for at least an error-detecting-and-correcting (EDAC) code. The user data is stored in a smaller number (N) of the words, with the remaining number (M) of words being used to store a map of which portions, if any, of each word are not usable. The N words of user data storage can include S normal storage words and (N−S) spare words, each for use if one of the normal storage words has too many unusable portions. A portion of each word length can contain at least one spare word portion, to which a block of data can be moved if any bit of a like-sized portion of the normal storage word is unusable. The reliability of storage is greatly improved by extension of each word to add EDAC encoding and spare-bit portions, as well as by extension of depth to allow spare words to be present, along with high-reliability storage of word maps.

14 Claims, 7 Drawing Sheets

| BIT 36 R/W | BITS 27-35 N (512 MAX) | BITS 23-36 M (16 MAX) | BITS 21-32 L (14 MAX) | BITS 15-20 G (64 MAX) | BITS 4-14 P (1024 MAX) | BITS 1-4 W (16 MAX) |
|---|---|---|---|---|---|---|

FIG.1c

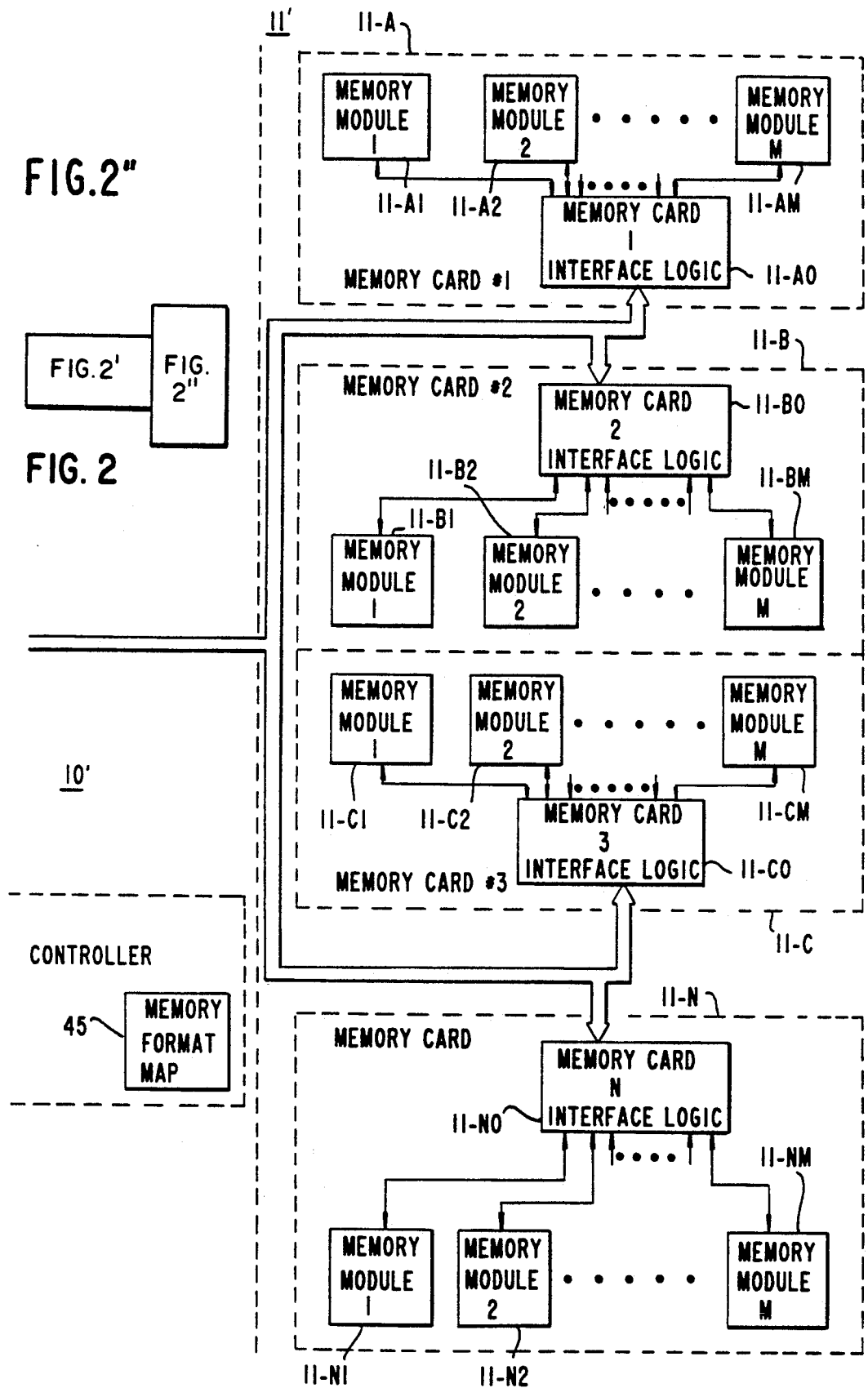

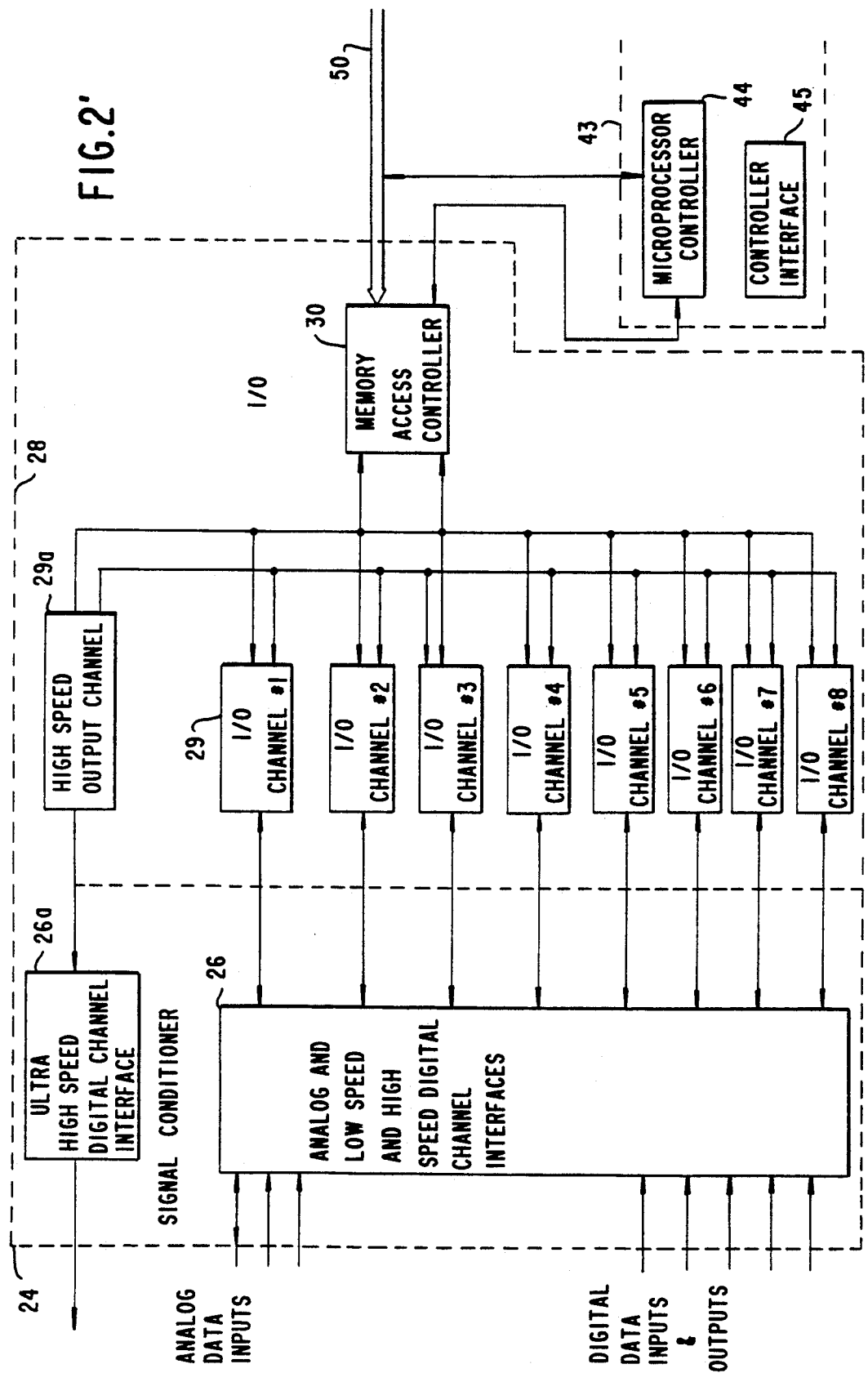

FAULT-TOLERANT MEMORY SYSTEM WITH GRACEFUL DEGRADATION

FIELD OF THE INVENTION

This invention relates to data memory systems and, more particularly, to a novel memory system capable of tolerating both hardware and system software faults, to achieve a high level of reliability.

BACKGROUND OF THE INVENTION

It is well known to provide certain data-intensive systems with large amounts of data memory. In certain situations, this data memory must be highly reliable and tolerate almost any form of fault which could threaten its proper performance. For example, the memory system utilized with a self-contained data-gathering vehicle, such as a submersible for obtaining data from the ocean floor or a spacecraft for obtaining data from an extraterrestrial source, should properly store data in such a manner as to allow retrieval of the data at the end of the mission, even if unexpected occurrences render a portion of the memory unusable. Therefore, it is highly desirable to provide a data memory system which is capable of tolerating faults both in the memory hardware and softward, as well as a memory system in which the performance gracefully degrades even if a high level of faults are present.

BRIEF SUMMARY OF THE INVENTION

In accordance with the invention, a fault-tolerating memory system comprises: a data memory having a multiplicity (M+N) of data storage words each having a length greater than the length of user data to be stored in that word, with the extra word length being used for at least an error-detecting-and-correcting (EDAC) code; the user data is stored in a lesser-multiplicity (N) of the words, with the remaining plurality (M) of words being used to store a map of which portions, if any, of each word are not usable. The N words of user data storage can include S normal storage words and (N−S) spare words, each for use if one of the normal storage words has too many unusable portions. A portion of each word length can contain at least one spare word portion, to which a block of data can be moved if any bit of a like-sized portion of the normal storage word is unusable. The reliability of storage is greatly improved by extension of each word to add EDAC encoding and spare-bit portions, as well as by extension of depth to allow spare words to be present, along with high-reliability storage of word maps.

In a presently preferred embodiment, two spare portions are provided for each word, and the EDAC code allows an additional one-memory-IC-wide portion to be unusable, so that three unusable word portions can be overcome, before a spare word must be used.

Accordingly, it is an object of the present invention to provide a novel method for fault-tolerant data storage and a novel fault-tolerant data memory system.

This and other objects of the present invention will become apparent to those skilled in the art upon reading the following detailed description, when considered in conjunction with the associated drawings.

BRIEF DESCRIPTION OF THE DRAWINGS

FIG. 1c is a schematic illustration of a word of address data for determining a storage location in the memory of the present invention;

FIGS. 2, 2' and 2" is a schematic block diagram of a fault-tolerant memory system in accordance with principles of the present invention.

DETAILED DESCRIPTION OF A PRESENTLY PREFERRED EMBODIMENT OF THE INVENTION

Figure 1A:
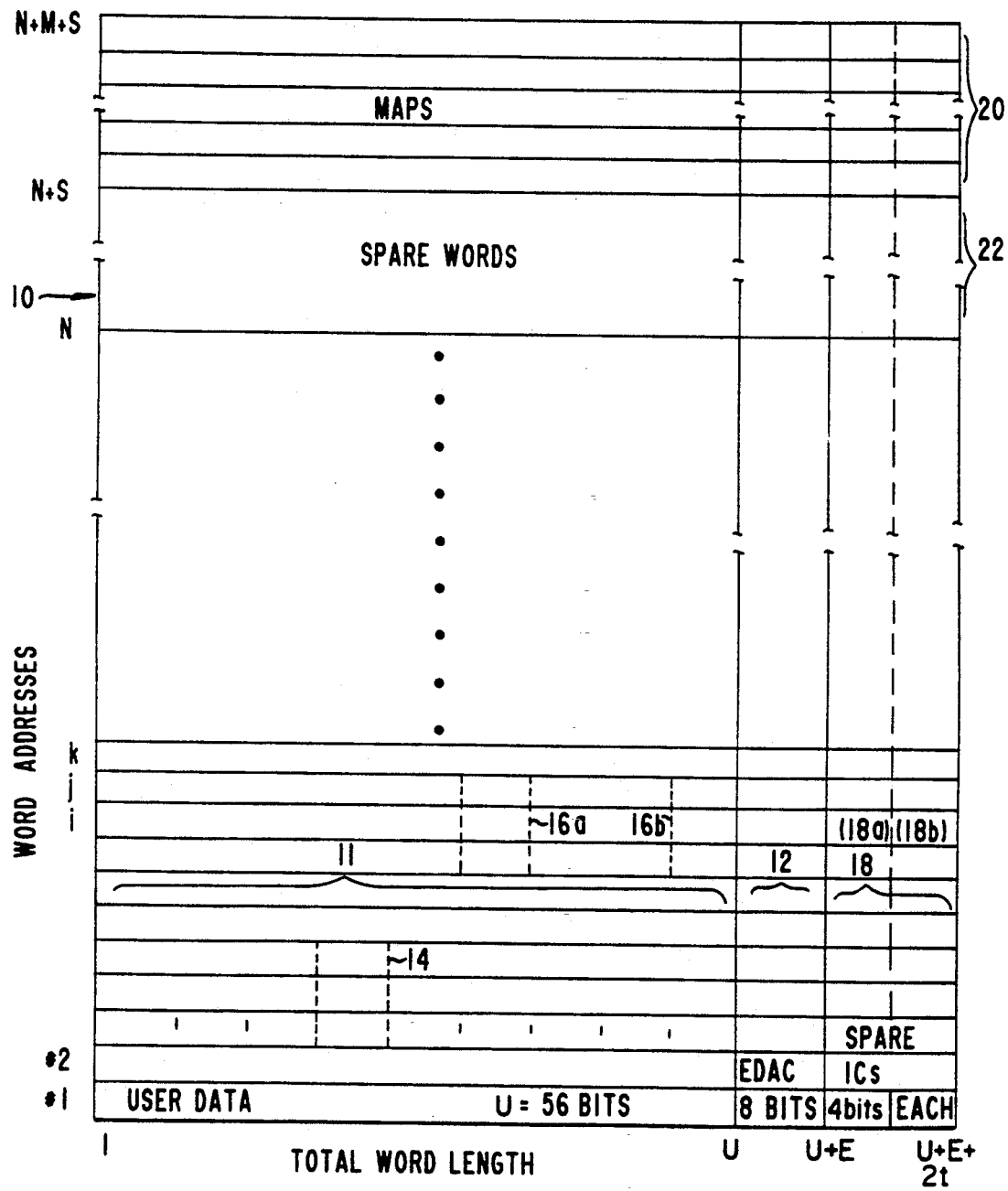
FIG. 1a is a memory map illustrating the location of various features of the present invention.

Referring initially to FIG. 1a, a memory system 10 in accordance with the present invention stores words by assembling input, or user, data into a user data word of some predetermined length U, e.g. U=56 bits. We have found that the use of a unique 2-dimensional virtual mapping of the data to the memory hardware can achieve a very high level of reliability. The first virtual mapping dimension is the storage word length dimension (here shown in the horizontal direction) wherein Error Detection And Correction (EDAC)) encoding is utilized for each user data word; this encoding adds an additional number of E bits, e.g. E=8 bits, but preferably allows correction of each single burst of at least one error bit and detection of errors in bursts twice as wide. For example, if one commences memory system design by selection of the number of data bits to be stored in parallel in each of the memory words, one must select the memory integrated circuits utilized for the storage arrangement. The most common currently-available memory ICs store bursts of data with a width of 1 bit, 4 bits (nybble) or 8 bits (byte). Thus, in the total memory map 10, the user data map area 11 will, if a user data length of 56 bits is to be provided and memory IC of 4-bits-width are used, be (U bits wide/bits per IC)=(56/4)=14 ICs wide; the EDAC memory area 12 will, if an 8-bit error correcting code is utilized, be (8 bits wide/4 bits per IC)=2 ICs wide. It should be understood that we prefer to use an error correcting code which produces single IC-width error correction and double IC-width error detection: for single-bit-wide memory ICs, this correction/detection criteria is met using Hamming codes; if the memory ICs produce outputs of 4 (or 8) bits in parallel, then a EDAC code that corrects a single burst of 4 (or 8) bits and detects errors in a pair of 4 (or 8) bit bursts, is required. For a system using 4-bit-wide ICs, we have chosen the use of a Reed-Solomon 64.14 code; for an 8-bit-wide-IC system, a code such as the Srinivasan Block code and the like can be used, although such codes are very inefficient for short word lengths of less than about 100 bits; accordingly, the user data word of 56 bits is best implemented with 4-bit-wide memory ICs.

Our storage word length U+E (the horizontal dimension of data spaces 11 and 12) is now a total of 64 bits, corresponding to 16 parallel 4-bit-wide ICs. The use of the EDAC code allows data lost in 1 nybble, as by the failure of any one IC 14, to be recovered; in other words, failure can be completely tolerated of any one of the 16 ICs required for the total 64-bit-wide storage word. This will be true for each storage word, even though the memory space taken up by any one particular IC 14 will span a multiplicity of such words (e.g. a bad memory IC of the 1M×4 type will thus provide erroneous nybble-wide sections for 1,048,576 consecutive data words), in manner well known to the art. Consider, however, the situation where more than 1 IC in any particular word is defectively storing data; for example, in the j-th word, defective ICs 16a and 16b both cause 4-bit-wide chunks of the storage word to be erroneous. While the EDAC code stored in area 12 can detect that there are two error "bursts", or sections of contiguous data error bits, the EDAC code cannot correct both.

In accordance with another aspect of the invention, we provide at least one spare memory integrated circuit 18 for each word of the total memory 10. Each spare IC 18 can be mapped, in a process to be described in more detail hereinbelow, to store the data in any one of sections 16 which cannot provide proper storage. Thus, if there are two spare integrated circuits 18a and 18b for each total storage word, the same number (2) of voids 16a and 16b can be negated, in a memory word of the length $L = U + E + 2I$, where I is the number of bits per IC (here, $L = 72$ bits); the data in one bad nybble 16a is transferred to the tested-good nybble 18a, while the data in tested-bad nybble 16b is transferred to tested-good second nybble 18b. Data as to which nybbles are bad, and which require the data therefrom to be shifted into a spare nybble 18, are stored in data maps. Advantageously, a plurality M of such maps are stored in another section 20 of the memory, so that the map information benefits from the use of the EDAC encoding and/or spare nybbles, to provide a map which is highly reliable. This additional memory map space 20 is provided in the second, or word address, memory dimension, along with the additional EDAC memory portion 12 and additional spares portion 18, in the first, or word length dimension, are totally unique in our fault-tolerating memory system.

In accordance with another aspect of the present invention, we also provide in the word address dimension an additional portion 22 of spare word space, which is utilized in the event that the number of voids or error-producing spaces 16 in any block of words exceeds the number of word portions which can be corrected through the use of the EDAC encoding and/or use of the spare memory portions 18. Thus, if the memory map data (as may be stored in portion 20) indicates that the user words in an area of portion 11 has more gaps (e.g. 4) than the number (e.g. 2) of spares in area 18 plus the number (e.g. 1) of IC-width error-blocks correctable by the EDAC code in area 12, then those words cannot be used for reliable storage and the incoming data must be either stored in a next-available one of the spare words of portion 22, or storage must be forfeit (i.e. storage capacity is "gracefully", or slowly, degraded).

Figure 1B:
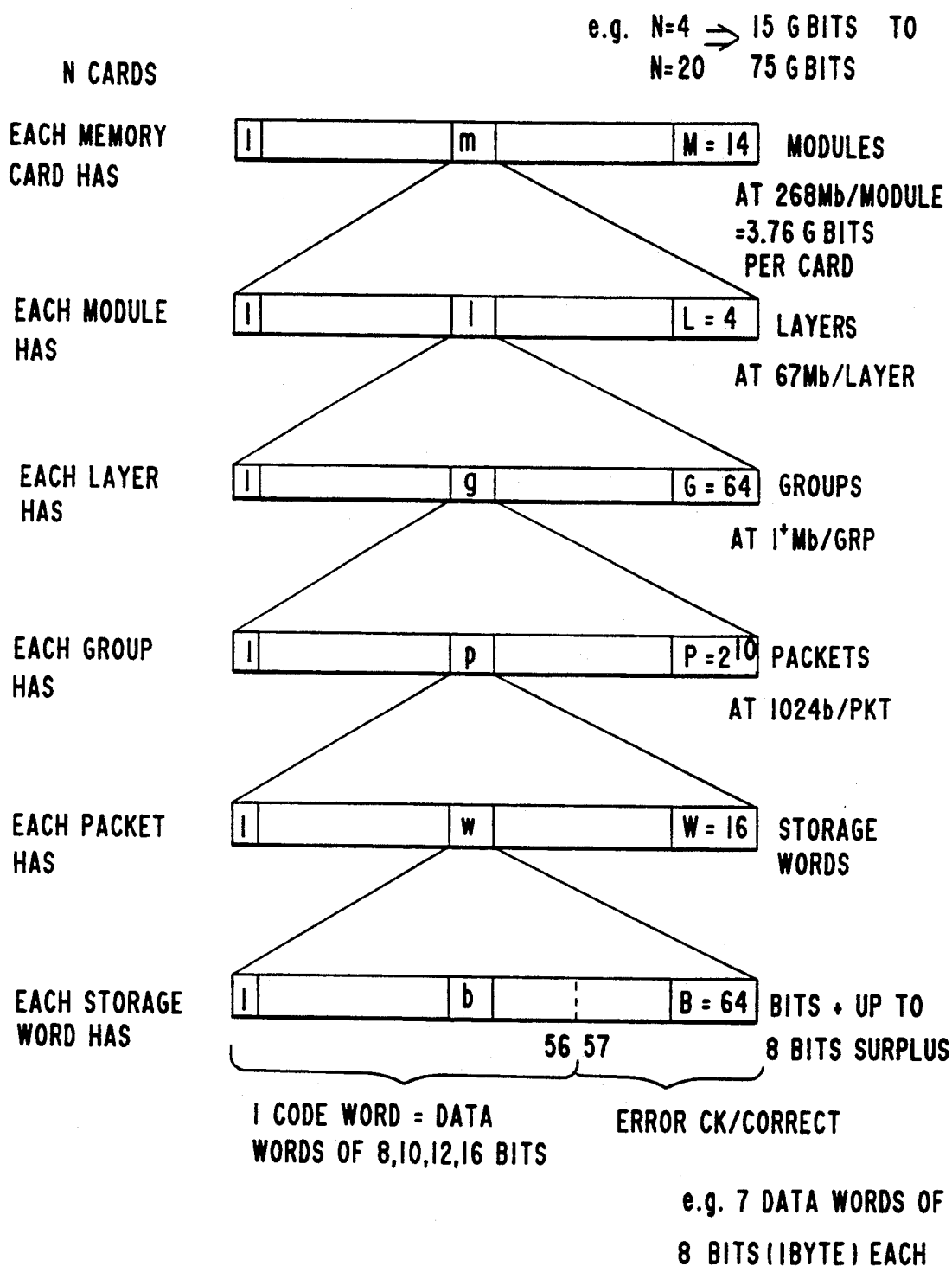
FIG. 1b is a diagram illustrating the manner in which the memory is subdivided into various modules, layers, groups, packets and storage words.

The memory space 10 may be organized as illustrated in FIG. 1b. Beginning at the bottom of the figure, it is seen that each storage word has a core of U user data bits (here, $U = 56$ data bits which can be assembled from input data words of 8, 10, 12, 16 and the like bits in length), with an additional $E = 8$ bits of EDAC encoding data, so that each storage word has a total bit count $B = 64$ bits. From the foregoing, it will be seen that, with two spare nybbles in area 18 being available, only 15 of the 18 nybbles in each total data storage word must be in proper storage operating condition for storage of a single data storage word. A selected plurality W (e.g. $W = 16$) of storage words are assembled into a data packet, with another plurality P (e.g. $P = 1024$) of packets being assembled into a group. A third plurality G (e.g. $G = 64$) of groups are then stored in the ICs of a single physical layer of a memory module. We utilized well-known physical layers, of the HDI (High-Density-Interconnect) type, which allow a plurality L (e.g. $L = 4$) layers of memory integrated circuit chips to be assembled in each of a plurality M of memory modules. The modules are assembled upon a card, with typically $M = 14$ or 16 modules per card. If a plurality N of cards (where N typically can range from 4 to 20 cards per memory system) are utilized, it will be seen that storage of between 15 and 75 gigabits can be provided in each memory system 10. Even though this is a huge memory space, any user data word location can be addressed and data read from, or written into, that space via a relatively short address word, here of 36 bits. One possible address word format is shown in FIG. 1c.

Figure 1D:
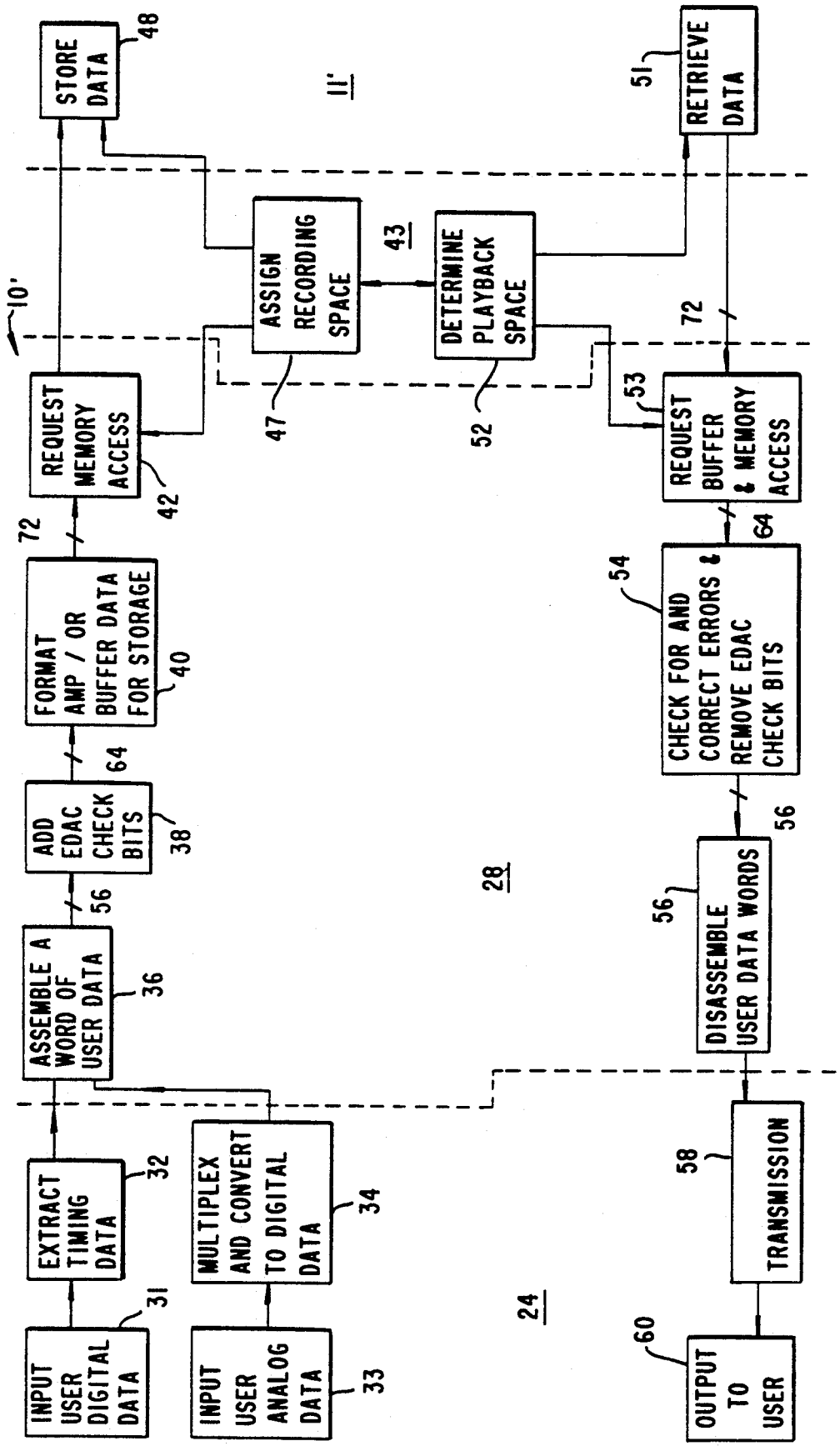
FIG. 1d is a data flow diagram illustrating the methodology for storage of data input to the memory system and for output of data retrieved from the memory system of the present invention.

Referring to FIG. 1d, the method by which user data input to the memory system 10' is stored within the memory ICs 11', and is retrieved therefrom and subsequently output from the system, is graphically illustrated in the data flow diagram, and may be better understood by simultaneous reference to the apparatus block diagram of FIG. 2. A signal conditioner assembly 24 includes channel interfaces 26, of known type allowing analog, low-speed digital and/or high-speed digital data to be received and transferred to an input/output (I/O) processing assembly 28. The I/O means 28 includes a plurality of channel means 29 and a memory access control means 30. If input user digital data is received (step 31), then timing data is extracted in step 32; if user analog data is input (step 33), then the various analog signals are multiplexed into one or more common analog-to-digital converters and the analog data is converted to digital data in step 34, with the processes of steps 31-34 taking place within interface means 26. The resulting digital data is passed by means 29 into the memory access controller means 30, wherein a word of user data is assembled (step 36). This data word (here, of $U = 56$ bits of user data) is then sent into step 38, where the bit totals are evaluated and EDAC check bits are added thereto (here, $E = 8$ bits of error detection and correction coding). The user/EDAC data word is now (step 40) formatted and/or buffered in preparation for storage, which may add additional bits (here of 2I). The total storage data word (here of $U + S + 2I = 72$ bits length) is provided to step 42, where memory access is requested. The memory access process involves the memory access controller means 30 exchanging information with a controller means 43, which includes a microprocessor controller means 44, a controller interface 45 and a memory format map storage means 46. The microprocessor controller means 44, in step 47, assigns a recording space to the data word, after consultation with memory format map 46 to determine which memory ICs for a particular word are unusable, or, if more IC-wide portions are unusable then can be corrected for with either the EDAC and/or additional memory provided, then to direct storage in a next-available space in the "spare words" portion 22 of the memory. Once the recording space has been assigned, data is stored (step 48) in the physical semiconductor memory portion 11', by transfer over a databus 50.

The physical memory means 11' comprises, as mentioned hereinabove, a plurality N of individual memory cards 11-A through 11-N. Each k-th card, where $A \leq k \leq N$, contains a memory card interface logic means 11-k0 and a plurality M of modules 11-k1 through 11-kM (e.g. the memory modules 11-A1 through 11-AM of the first memory card A). The card receives a storage address word and then, having accessed that addressed word via the interface logic means, stores the next-received data word at the indicated address.

The stored data is output from the memory in step 51, wherein, after reference to step 52, the "playback" space is determined and that memory space is accessed to retrieve the data (step 51) stored therein. Thus, a full 72-bit-wide total data word is retrieved from a next-accessed location, in accordance with the particular address for that word. The word is passed back to the memory access control 30, in the I/O means 28, and, in step 53, buffer and memory map access is again requested. The information in the memory format map 46 is applied to the access controller and, while still in step 53, the additional (unused or unusable) portions (nybbles) of the 72-bit total storage data word are removed. Thus, a word containing only the user data and the EDAC code bits (here, a 64-bit data word) is passed from step 53 to step 54. In step 54, operating within the memory access controller means 30, the EDAC check bits (E bits in number) at the end of the $U+E=64$ bit word are removed and this $E=8$ set of check bits utilized to check for errors in the remaining U bits of user data (which need not be contiguous, as one or two spare nybbles 18a/18b could have been substituted for unusable nybble 16a/16b, and their substitution would have been recognized, in prior step 53, by reference to the memory map. The correct $U=56$ bits of user data are then passed to step 56, where the memory access controller disassembles the U bits into the individual user data words. The individual data words are sent from means 28, via one or more of the I/O channel means 29, and are prepared for transmission in the associated channel interface means 26, in step 58. The user data is now output to the user, in step 60, via either the digital data outputs or, if previously selected, via a special ultra-high-speed digital channel, having its own channel means 29a and interface means 26a.

Figure 2A:
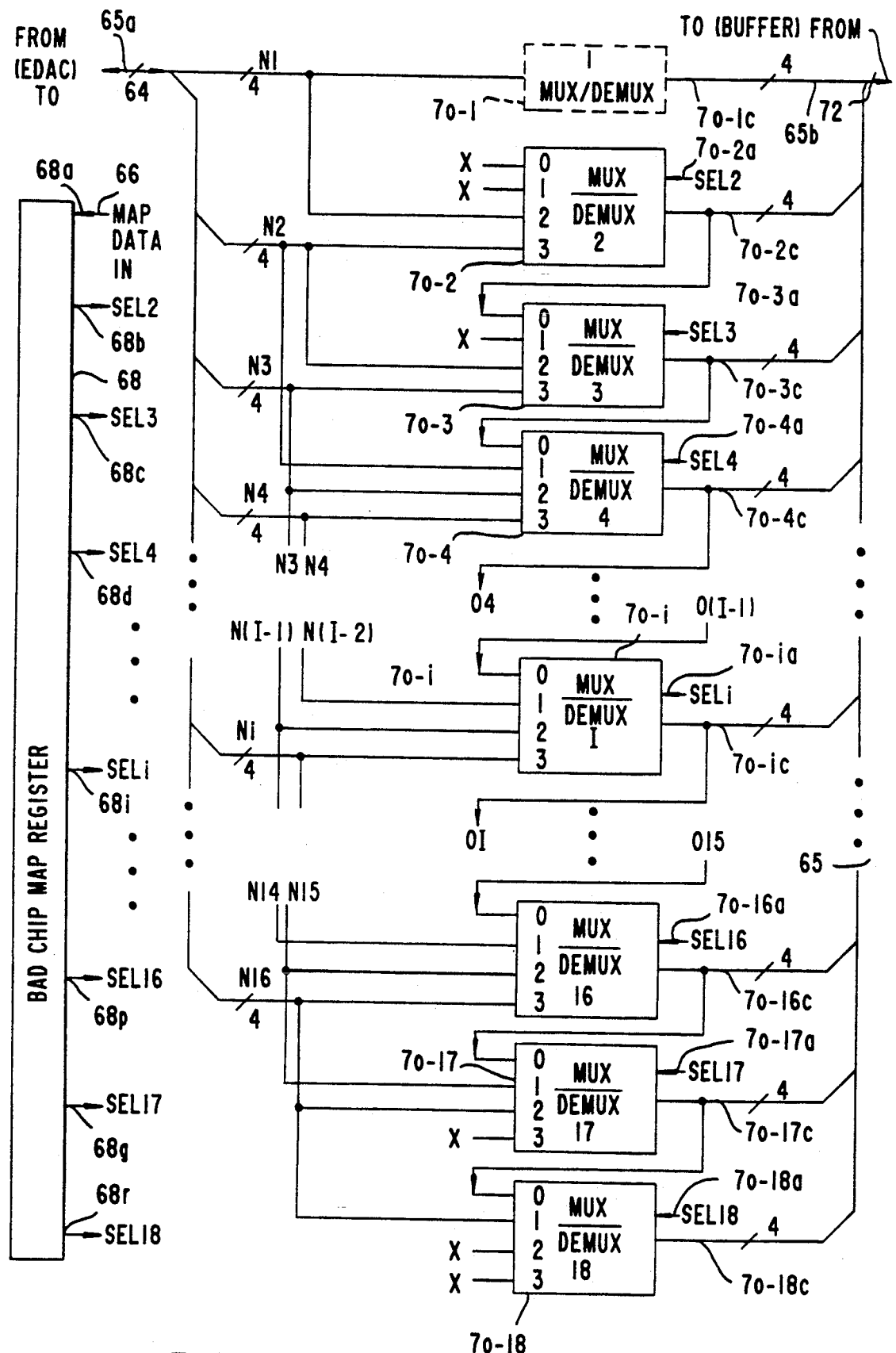
FIG. 2a is a schematic block diagram of a data formatter for use in the memory system.

Referring now to FIG. 2a, one presently preferred embodiment of a bi-directional formatting means, forming part of the memory access means 30 of the I/O means, and used in steps 40 and 53, is shown. Format means 65 has a first port 65a which, when means 65 is utilized in step 40 of the storage mode, receives the $U+E$ (=64) bits from the EDAC means, and has another port 65b, which in the storage mode provides the $U+S+2I$ (=72 bits) total storage word to the buffer means, from which the buffered storage word will be sent to the actual memory ICs. Conversely, in the data retrieval mode, port 65b receives the 72 bits of data from the memory, and in step 53, means 65 reformats the data word into the 64-bit words to be sent from port 65a to the EDAC checking step 54. As previously explained hereinabove, the purpose of data formatter means 65 is to map any bad memory chips out of the data storage word. In the example, the integrated circuit chips are 4 bits wide and up to 2 bad IC chips are allowed in each layer, so that there can be 8 bad bits in each word, due to defective IC chips. Therefore, the entire purpose of formatter means 65 is to provide 64 known good bits in a 72 bit word, by operation in conjunction with the bad chip map 46 maintained for each (HDI) layer; this memory format, or bad chip, map is always updated on power-up of the memory means 10', as well as during standby memory testing. The bad chip map data is brought in on a bus 66, preferably from the mapping area 20 of the high-reliability memory storage space itself. The map data is brought in both during record, to allow the 64-bit word to skip over defective chips by expanding itself into a maximum of 72 bits of length, and is also present during playback so that only the good 64 bits, utilized in storage, are selected for passage on to the EDAC decoding step. The map data bus 66 is supplied to an input 68a of a bad chip map register means 68, having a plurality of outputs 68b–68r, to determine which of the nybbles of data are routed to which memory chips, to avoid any bad chips present in the particular layer. Each of the SEL j, for $2 \leq j \leq 18$, selector outputs is utilized as the selection control input signal to the selection control input 70-2a to 70-18a of an associated multiplexer/demultiplexer (MUX/DEMUX) means 70-2 through 70-18. In this particular embodiment, a first MUX/DEMUX means 70-1 is not utilized, and is therefore shown in broken-line manner, as the first nybble N1 is always a part of the output data word. Each means common terminal 70-jc is connected to a "zero-select" input of the next-higher means 70-(j+1). Each means 70-2 through 70-18 receives 2 control bits, so that 4 possible inputs (the 0-th input through the third input) can be individually selected for connection to the associated common terminal 70-jc. The third input receives the nybble corresponding to the number J of that MUX means, e.g. the third MUX means 70-3 receives the third nybble N3. The second input receives the next lower nybble (e.g. the second input to MUX means 17 receives the 16th input nybble N16; the first input receives a two-nybbles-lower input, if available (e.g. the "one" input of MUX 18 receives the $(18-2)=16$ nybble N16). Thus, the microprocessor controller means 44 loads the proper bad memory chip format map 46 to the formatter means 65, and more specifically into register means 68, as the microprocessor knows which memory layer is in use and has a map for each layer in the system; the map is updated when the system is not being used in a record or playback mode of operation. Register 68, holding the bad chip map, allows the data to be shifted, 4 bits at a time, to skip over defective chips. This is accomplished by taking the U bits of input from port 65a and breaking that up into the 16 nybbles labelled N1 through N16. The MUX means select lines SEL2 through SEL18, being derived from the bad chip map in register 68, allow the defective chips to be skipped over. As an example, assume chips 2 and 3 in a layer are defective, so that the MUX selection proceeds as follows: The first nybble N1 will always appear at the output of the first MUX means, which therefore does not need to be physically present. The second nybble N2 will appear at the common line 70-2c of the second MUX means, but since the second IC chip in that layer is known to be defective, the third MUX means 70-3 is instructed, via SEL3, to pass the N2 nybbles on to the third MUX means 70-3. The nybble N2 is also present at the third MUX means common output 70-3c; however, since chip 3 is also defective, and must therefore be an input to the fourth MUX means 70-4; it is the fourth MUX means 70-4 which will select N2 and write this second nybble to the fourth IC chip of the sequential group of 18 chips making up the total storage layer. Similarly, the common output of the fifth MUX means will provide the third nybble N3 if the fourth nybble group will be provided at the output of the sixth MUX means and so forth, so that every 4-bit nybble is shifted 2 nybble positions until the final MUX means 70-18 will select the last nybble N16. The same defective chip information is utilized on playback (i.e. read data from memory) to select the 64 valid data bits from the 72 bit total word. The designation of port 65a as an input (store) or output (read) and the designation of port 65b as an output (store) or input (read) is determined by whether or not a read or write operation is set up by the most significant bit of the word address.

While one presently preferred embodiment of our fault-tolerant memory system with graceful degradation (i.e. a fault prevents successful data storage only if more than a specific member of faults per word are present, and only if, in addition, all spare words of memory are already in use) is described in detail herein, many variations and modifications will now become apparent to those skilled in the art. It is our intent, therefore, to be limited only by the scope of the impending claims, and not by way of specific details and instrumentalities presented herein by way of illustration.

What we claim is:

1. A method for tolerating faults during the storage of data words in a gigabit memory system having a multiplicity of individual memory integrated circuits (ICs) and a totality of storage words, each having a multiplicity of bytes to be stored in a plurality of different ICs, comprising the steps of:
   (a) dividing the totality of storage words into a first multiplicity of storage words and a second multiplicity of storage words;
   (b) storing in the second multiplicity of storage words at least one updatable map of known-good space in each of the storage words in the memory;
   (c1) first forming each data word with a first multibyte portion of received user data, a second portion of at least one byte of EDAC-encoding data for detecting and correcting errors in the multiplicity of bytes of user data of the first portion of the same data word, and a third portion as a spare storage space with a sufficient length to allow a plurality of multiple-bit bursts of unusable storage bits in the user data and EDAC-encoding data portions of that same data word to be tolerated;
   (c2) determining if at least one burst of unusable data bits exists in a next available storage word in the system memory;
   (c3) then transferring the data bits in each burst of user data and EDAC-encoding data corresponding to an unusable memory burst portion in that word to the third portion of that same data word, prior to storage;
   (d) after step (c3), storing each sequentially-received EDAC-encoded data word in that next-available one of the first multiplicity of storage words having sufficient known-good space for storage of a data word, as determined by reference to the at least one map in the second multiplicity of storage words;
   (e) retrieving stored data from a sequence of the first multiplicity of storage words determined by reference to the at least one map in the second multiplicity of storage words; and
   (f) then removing unusable burst and other errors in that data word, by (1) first transferring back to the proper burst locations within the same data word, as determined by reference to the associated map, the bit bursts from the third portion of that data word, (2) removing the third word portion to obtain a burst-transferred retrieved word, and then (3) utilizing the EDAC coding data of each retrieved burst-transferred word to correct at least one burst of user data error.

2. The method of claim 1, wherein the EDAC-encoding step allows error in a plurality of multiple-bit bursts to be detected.

3. The method of claim 2, wherein each burst is one nybble in length.

4. The method of claim 1, further comprising the steps of: providing a spare word portion of memory; and storing an EDAC-encoded data word into the spare memory portion in the event that a storage word selected therefore in the first storage word multiplicity can not faultlessly contain the data word to be stored.

5. A method for storage of gigabytes of data, comprising the steps of:
   (A) recording data in a memory by the steps of
       (1) receiving user data;
       (2) adding EDAC-encoding data, based upon the received user data, to form a storage word;
       (3) formatting the storage word by (a) adding a plurality of spare portions; (b) recognizing any existing burst of unusable data bits in a data word about to be stored; (c) transferring, prior to storage, the bits occurring in any plurality of unusable bit bursts of any of user data and EDAC-encoding data for a present word, to the spare portion of that word;
       (4) determining, by reference to an updatable map, acceptable storage word spaces having sufficient good bits available for storage of any formatted storage word; and
       (5) storing the formatted storage word in a next available acceptable space; and
   (B) playing data back from the memory by the steps of
       (1) retrieving the formatted storage word from its assigned memory storage space;
       (2) unformatting the storage word by transferring back to the proper burst locations within the present word the bits previously transferred into the spare portion and then removing all spare portions;
       (3) utilizing the EDAC-encoding data to detect if any error has been introduced into the user data, and to correct at least a portion of the detected error in that storage word; and
       (4) outputting the corrected user data.

6. The method of claim 5, wherein the EDAC-encoding step (B3) detects a plurality of seperate errors and corrects at least one detected error.

7. The method of claim 5, wherein data from a plurality of unusable burst spaces can be saved in the plurality of spare portions of each storage word.

8. The method of claim 5, further comprising the steps of: providing a spare word portion of memory; and storing an EDAC-encoded data word into the spare memory portion in the event that a storage word initially selected therefore can not acceptably contain the data word to be stored.

9. The method of claim 5, further comprising the step of transferring to a spare word storage space any storage word having a greater number of unusable burst spaces than can be overcome by use of the EDAC-encoding and spare data word portions.

10. The method of claim 9, further comprising the steps of: mapping all storage words to determine the location of unuseable burst spaces; and storing the maps in a portion of the total memory space.

11. The method of claim 10, wherein each map is stored as at least one data word having its own EDAC-encoding and spare data portions.

12. Data storage apparatus, comprising:
memory means for storing a gigabit multiplicity of multi-byte storage words, each having a user data portion of an integer number of nybbles in length and having a spare word portion:
dynamic means for periodically mapping at least those of the storage words then having at least one burst of a plurality of bad storage bits therein, and for storing the bad-burst map until a next mapping;
means for receiving and outputting user data;
means for EDAC-encoding an assembled word of the received user data prior to storage and for adding a plurality of spare data portions to each data word for receiving up to a like plurality of bursts of data bits identified as having bit positions identical with those positions mapped as bad, and for operating upon a data word retrieved from said memory means first to restore transferred bit bursts to their original positions and then to detect error is the restored retrieved word and correct at least a portion of the detected error before transmittal to the outputting means; and
means for determining, in cooperation with said mapping means, a location within said memory means into which, in a storage operation, to store a data word, including locations in the memory means spare word portion in the event that a storage word location initially selected for a data word can not acceptably contain the data word to be stored, and also for determining from which location, in a retrieval operation, to take a data word.

13. The apparatus of claim 12, wherein the mapping means stores at least one storage word location map within the memory means.

14. The apparatus of claim 12, wherein each storage word has a user data portion of an integer number of nybbles in length, with said EDAC-encoding means providing an additional two nybbles of data, and said formatting means using two spare portions, into each of which an associated nybble of user data and EDAC-encoding data can be transferred.

* * * * *